United States Patent
Pan et al.

(10) Patent No.: US 8,928,113 B2
(45) Date of Patent: Jan. 6, 2015

(54) LAYOUT SCHEME AND METHOD FOR FORMING DEVICE CELLS IN SEMICONDUCTOR DEVICES

(75) Inventors: Hsien-Yu Pan, Hsinchu (TW);
Jung-Hsuan Chen, Hsinchu (TW);
Shao-Yu Chou, Chu Pei (TW);
Yen-Huei Chen, Jhudong (TW);
Hung-Jen Liao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 238 days.

(21) Appl. No.: 13/082,497

(22) Filed: Apr. 8, 2011

(65) Prior Publication Data
US 2012/0256235 A1    Oct. 11, 2012

(51) Int. Cl.
*H01L 23/52* (2006.01)
*H01L 27/108* (2006.01)
*H01L 29/94* (2006.01)
*H01L 21/70* (2006.01)
*H01L 27/02* (2006.01)
*H01L 27/11* (2006.01)
*H01L 27/118* (2006.01)

(52) U.S. Cl.
CPC ............. *H01L 27/0207* (2013.01); *H01L 27/11* (2013.01); *H01L 2027/11887* (2013.01)
USPC ............................. 257/508; 257/208; 257/296

(58) Field of Classification Search
USPC .......................... 257/508, 208, 296
See application file for complete search history.

(56) References Cited

U.S. PATENT DOCUMENTS

| | | | | |
|---|---|---|---|---|
| 6,756,652 B2* | 6/2004 | Yano et al. | | 257/508 |
| 7,911,792 B2* | 3/2011 | Liang et al. | | 361/699 |
| 8,017,438 B2* | 9/2011 | Bauer et al. | | 438/109 |
| 2004/0089913 A1* | 5/2004 | Yano et al. | | 257/508 |
| 2012/0243195 A1* | 9/2012 | Lim et al. | | 361/784 |

FOREIGN PATENT DOCUMENTS

| | | |
|---|---|---|
| CN | 1499639 A | 5/2004 |
| KR | 1020040041000 A | 5/2004 |

OTHER PUBLICATIONS

Official Action issued Apr. 18, 2013 in counterpart KR Patent Application No. 10-2011-0076018.

* cited by examiner

*Primary Examiner* — David Zarneke
(74) *Attorney, Agent, or Firm* — Duane Morris LLP (57) ABSTRACT

A method and layout for forming word line decoder devices and other devices having word line decoder cells provides for forming metal interconnect layers using non-DPL photolithography operations and provides for stitching distally disposed transistors using a lower or intermediate metal layer or a subjacent conductive material. The transistors may be disposed in or adjacent longitudinally arranged word line decoder or other cells and the conductive coupling using the metal or conductive material lowers gate resistance between transistors and avoids RC signal delays.

5 Claims, 8 Drawing Sheets

LAYOUT SCHEME AND METHOD FOR FORMING DEVICE CELLS IN SEMICONDUCTOR DEVICES

TECHNICAL FIELD

The disclosure is directed to a highly integrated layout scheme for device cells in word line decoder devices or other semiconductor devices, using single pattern lithography.

BACKGROUND

Various semiconductor devices used in various applications and which serve a variety of functions, employ SRAM cells or other repeating device cells that are arranged in arrays and coupled to one another. As one example, word line decoder devices serve a variety of functions in the electronics world, and utilize a high number of word line decoder cells and SRAM (static random access memory) cells. These semiconductor devices typically include layouts that utilize repeating arrays for design convenience. One common layout includes repeating arrays of the word line decoder cells. Such an arrangement of repeating cells is favored because it represents an established and common design that provides high levels of integration and includes multiple functional transistors in minimal area. One common arrangement includes word line decoder cells disposed in repeating arrays that include longitudinal word line decoder cells laid end-to-end along bit lines.

Word line decoder cells may include multiple levels of metal interconnect layers with the upper metal layer often used as word line connectors and one of the subjacent, intermediate metal layers used for power signals, ground signals or other signals and/or other interconnection functions. Because there is a challenge to always increase integration levels by producing smaller features, one method and technique for forming such word line decoder cells includes using DPL (double patterning lithography) to form a pattern in a metal interconnect layer. DPL involves the use of two photomasks, two sets of photolithography operations and two etching operations to form one pattern in the layer being patterned. An advantage of this DPL technique is that patterns with smaller pitches can be created. When a metal interconnect layer is formed to very small feature sizes, it can perform various interconnection functions. According to known technology, the upper metal layer may be used for global signal routing and large size devices and is also utilized for poly gate stitch routing.

Transistors formed in the word line decoder cells have polysilicon gates and stitching may be used to couple transistors that are spaced apart by a significant distance. This applies advantageously to longitudinally spaced transistors. Word line decoder cells are often formed in repeating arrays that include longitudinal word line decoder cells laid end-to-end along bit lines. The polysilicon gate transistors formed in one word line decoder cell are coupled, often by a polysilicon lead extending longitudinally from cell to cell, to transistors in other cells. Since polysilicon is a semiconductor material and not a conductive material such as metal, the polysilicon gates include some level of resistance and when the polysilicon leads extend over a significant distance from cell to cell coupling transistors, the aggregate resistance is significant and can cause signal delays, in particular signal RC delays. For this reason, the upper metal layer which is a conductive material, may be used to couple polysilicon transistor gates from one word line decoder cell to further transistor polysilicon gates in other word line decoder cells.

While the use of DPL enables a tighter pitch to be produced in underlying metal patterns which enables the upper metal layer pattern to extend through void areas in the underlying metal pattern for poly gate stitch routing, the double pattern lithography operations carry with them inherent shortcomings. One shortcoming associated with the use of double patterning lithography is high cost as two photomasks must be fabricated and used. Further, the two photomasks that combine to form one pattern are produced by a mask decomposition method which can be unreliable and time consuming. In addition to the costs associated with carrying out two each of the photolithography operations of coating, exposing and developing, and two etching and stripping operations, the time associated with having to perform each of these operations two times carries with it a cost and delay in cycle time. Finally, the use of yet another photomask carries with it an additional inherent risk of misalignment and/or rework.

Conventional operations for forming devices with repeating word line decoder cells, SRAM cells, or other cells, using DPL methods, therefore include various shortcomings.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity, unless indicated otherwise. Like numerals denote like features throughout the specification and drawing.

DETAILED DESCRIPTION

The disclosure provides for routing using metal interconnect layers to overcome high poly gate resistance and enables the manufacture of word line decoder cells, dual port and other SRAM cells, or other semiconductor device cells used in a repeating manner, while circumventing the need to use the time consuming and cost restrictive operation of DPL. Polysilicon transistor gates from the same cell or adjacent cells may be connected using a metal interconnect instead of the upper metal layer, to reduce gate resistance.

The disclosure finds application in the formation of word line decoder devices that utilize SRAM cells and various other devices that serve a variety of functions in the electronics world, and utilize repeating arrays of cells.

Figure 1:
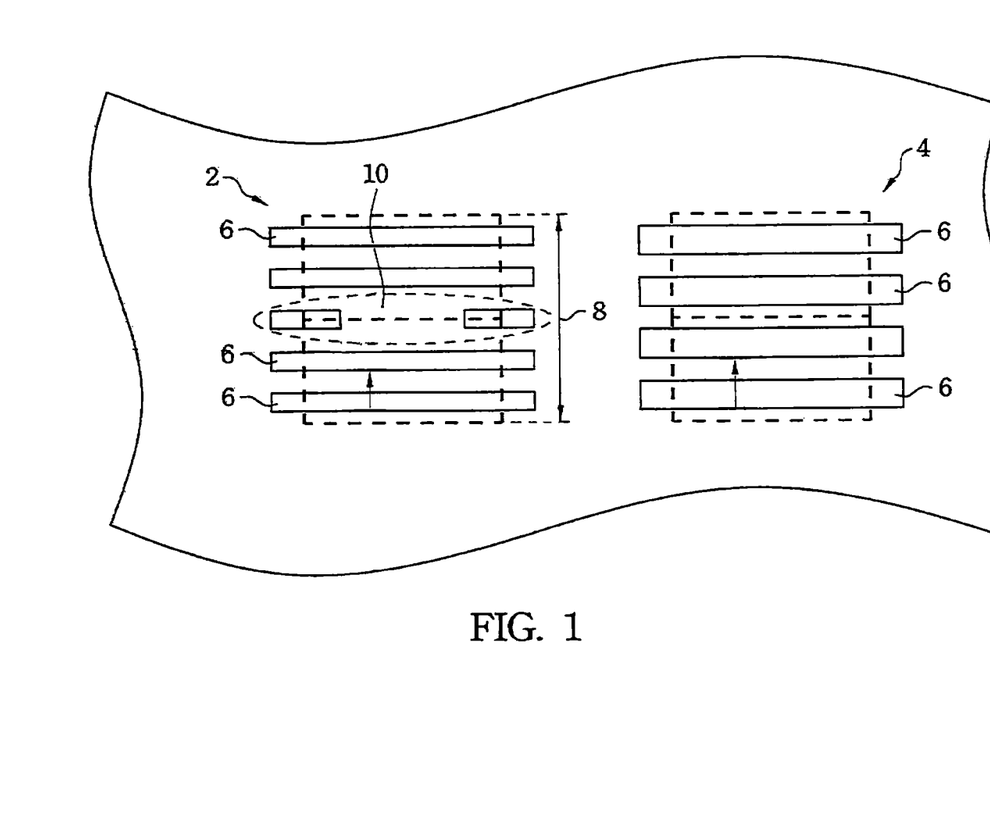
FIG. 1 is a plan view showing a comparison of an exemplary metal 2 pattern formed using DPL and formed using a single photomask.

FIG. 1 is a plan view showing a comparison between a pattern formed in a metal layer using DPL, on the left hand side, and a pattern found using a single photolithography operation, on the right hand side. Pattern 2 on the left hand side is drawn to the same scale as pattern 4 on the right hand side, and they are presented side-by-side, for comparative purposes and to highlight differences between the two. Pattern 2 includes five metal leads 6 formed within dimension 8 and these metal leads may include a pitch of about 64 nm whereas pattern 4 on the right hand side formed using a single photolithography operation includes only four metal leads 6 across the same space 8 which may represent the pitch of two adjacent word line decoder cells. The metal leads 6 in pattern 4 may include a pitch of about 88 nm in one exemplary embodiment. It should be understood that the values provided as pitches are exemplary only and FIG. 1 is presented to show that in the same space 8, fewer metal leads 6 are produced using a single photolithography operation than can be produced using DPL. Pattern 2 includes an extra routing channel that includes a void 10 through which stitching can occur, i.e. a layer formed over pattern 2 can extend through void 10 of pattern 2 to a feature below pattern 2.

Figure 2:
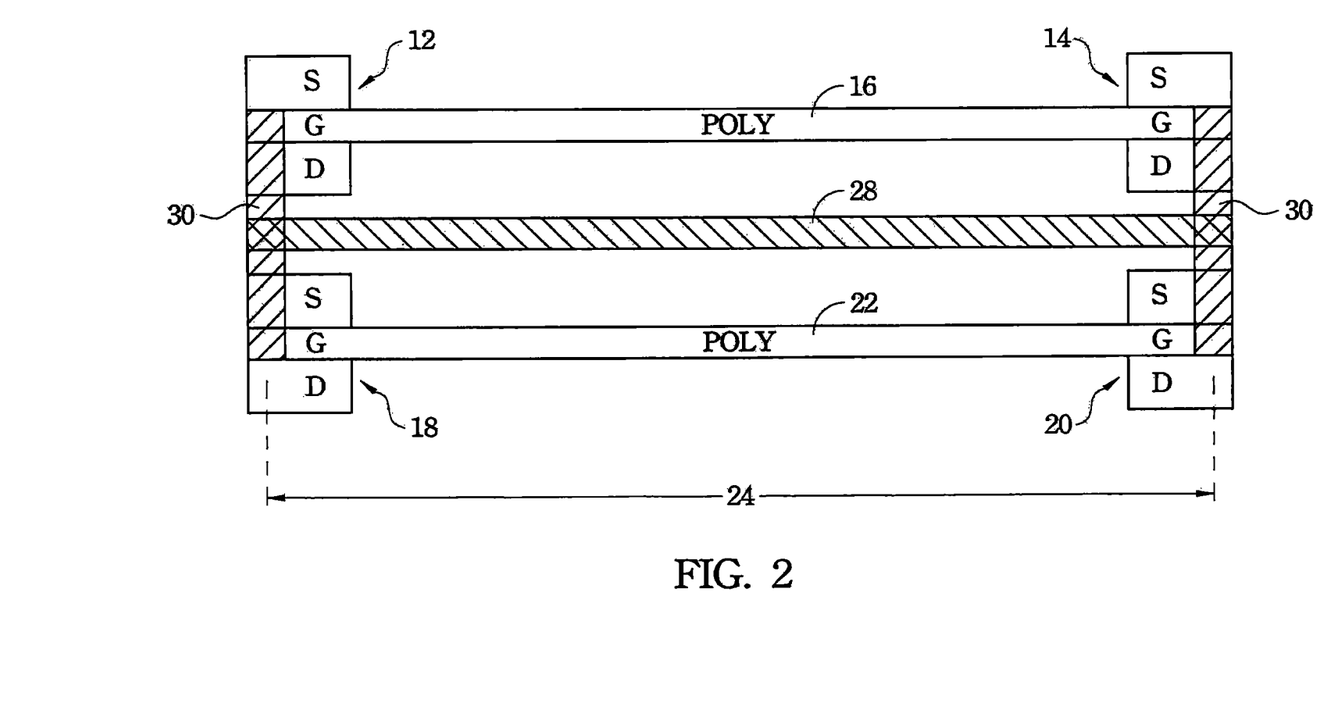
FIG. 2 is a plan view of a partial device layout showing a metal 1 stitch according to one aspect of the invention.

A stitching aspect according to an exemplary embodiment of the disclosure is shown generally in FIG. 2. Transistors 12 and 14 include gates G coupled by poly (polysilicon) lead 16 and transistors 18 and 20 include gates G coupled by poly lead 22. Although the features in FIG. 2 have been expanded or exaggerated for clarity, it should be understood that distance 24 is a significant distance in the sense that resistance along the respective poly leads 16 and 22 can be significant due to the length of distance 24 and can cause a signal delay between transistor 12 and transistor 14, and also between transistor 18 and transistor 20.

Coupled transistors 12 and 14 may represent transistors in successive device cells such as word line decoder cells or SRAM cells, that are aligned longitudinally. Coupled transistors 12 and 14 may represent transistors at opposed ends of a device cell such as a word line decoder cell, they may represent transistors disposed in different word line decoder cells, and they may represent transistors spaced apart by a significant distance such that the resistance of poly lead 16 can cause signal delays between the transistors. The same is true for transistors 18 and 20 with respect to poly lead 22. Conductive lead 28 stitches the poly gates by coupling the gates of transistors 12 and 14 and by further coupling the gates of transistors 18 and 20 thereby providing a lower resistance path for current and signal to travel between the gates of transistors 12 and 14, for example. Connective structure 30 couples poly leads 16 and 22 to conductive lead 28 and may be any of various subjacent conductive materials that enable conductive lead 28 to stitch the structures as shown. In one exemplary embodiment, connective structure 30 may be formed of tungsten or the like and conductive lead 28 may be formed of a metal such as Cu or Al or other suitable metals or alloys. Conductive lead 28 represents a metal interconnect layer, i.e. a metal layer that provides connection between metal features and may be referred to as a metal-metal conductive lead or a metal-metal interconnect lead. Hereinafter, conductive leads or metal interconnect layers will be understood to signify such metal-metal interconnect structures or layers. Conductive lead 28 may represent a first metal interconnect layer or one of an intermediate metal interconnect layer according to the exemplary embodiments illustrated in subsequent figures as discussed infra, and the structure/layout shown in FIG. 2 represents a substructure over which additional device layers will be formed to produce functional devices.

Figure 3A:
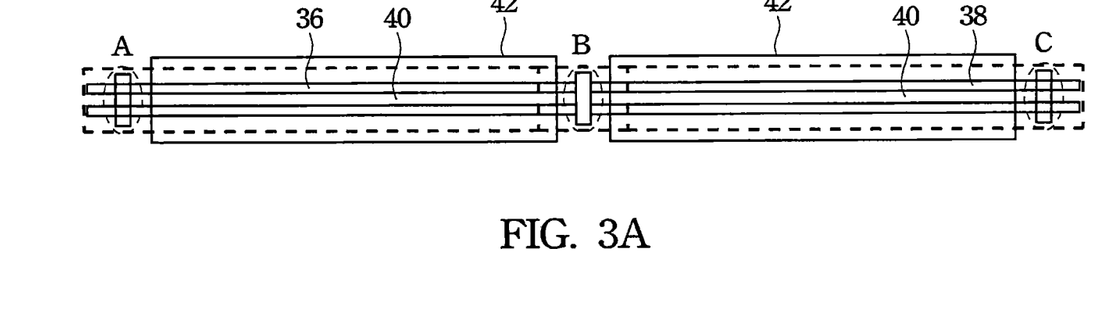
FIGS. 3A and 3B show a plan view and wiring diagram, respectively, of conventional transistor coupling.

FIG. 3A shows two substructures for cells 40 defined by respective active areas 42. Cells 40 are longitudinally arranged and may be word line decoder cells in one exemplary embodiment. Polysilicon lead 36 couples node A to node B and polysilicon lead 38 couples node B to node C. Each polysilicon lead 36 and 38 is either coupled to, or forms part of at least one transistor, namely the polysilicon gate of the transistor, and the transistor or transistors may be situated within active area 42 or essentially at or adjacent nodes A and B.

Figure 3B:
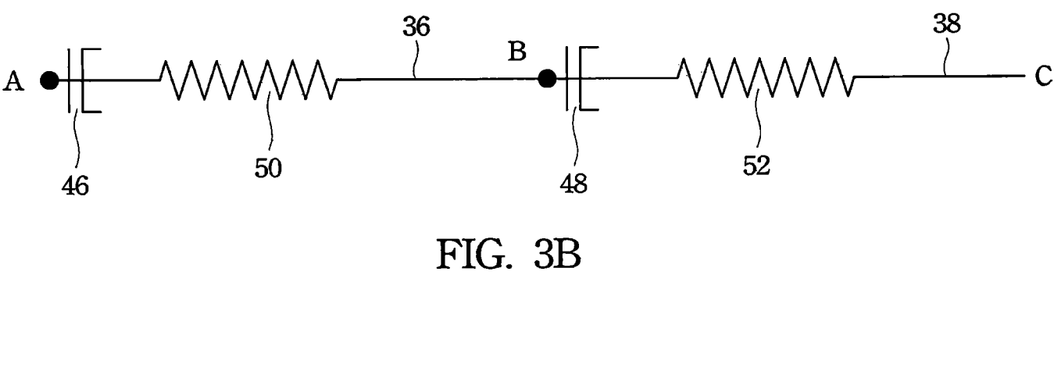

FIG. 3B is a wiring diagram corresponding to FIG. 3A and shows transistor 46 which includes a gate that is either at or near node A and also transistor 48 which includes a gate that is either at or near node B. Polysilicon lead 36 couples transistor 46 to transistor 48 and includes an associated gate resistance 50. Polysilicon lead 38 couples transistor 48 to node C at or near which polysilicon lead 38 may form a gate of a further transistor, not shown, and polysilicon lead 38 includes gate resistance 52. Gate resistances 50 and 52 represent the resistance associated with polysilicon leads 36 and 38, respectively.

Figure 4A:
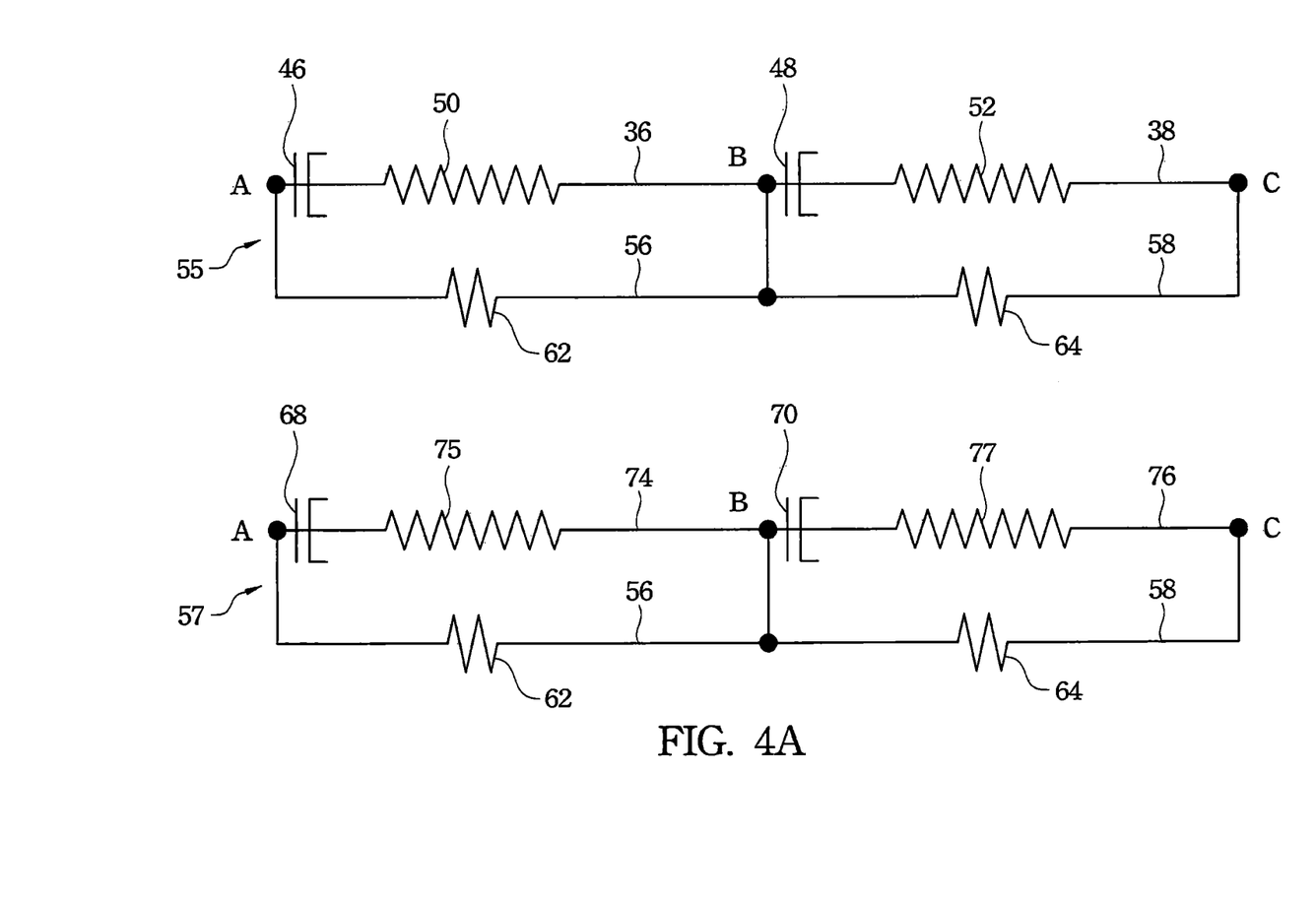
FIGS. 4A and 4B show wiring diagrams and a plan view of an exemplary word line decoder device layout, respectively, of metal 1 stitching of transistors according to an aspect of the disclosure.

FIG. 4A shows two wiring diagrams 55 and 57. Wiring diagram 55 shows the wiring diagram of FIG. 3B but with an additional coupling between nodes A and B and between nodes B and C. Conductive lead 56 couples node A to node B and therefore transistor 46 to transistor 48 and includes lessened resistance 62. Similarly, conductive lead 58 couples node B to node C and includes lessened resistance 64. Resistance 62 is less than resistance 50 and resistance 64 is less than resistance 52 as conductive leads 56 and 58 are formed of conductive materials that have a lower resistance than polysilicon leads 36 and 38. The wiring diagrams of FIG. 4A correspond to the layout shown in FIG. 4B.

Wiring diagram 57 shows a similar arrangement for transistors 68 and 70 and nodes A, B and C. Polysilicon lead 74 couples transistor 68 to transistor 70 and includes an associated gate resistance 75. Polysilicon lead 76 couples transistor 70 to node C at or near which polysilicon lead 76 may form a gate of a further transistor, not shown, and polysilicon lead 76 includes gate resistance 77. Transistors 68 and 70 include gates that are part of or are coupled to polysilicon leads 74 and 76, respectively. Gate resistances 75 and 77 represent the resistance associated with polysilicon leads 74 and 76, respectively, and are greater than resistances 62 and 64. Transistors 68 and 70 may be disposed in successive cells 40 or at or in the vicinity of nodes A and B, respectively, in one exemplary embodiment.

Polysilicon leads 36 and 74 are coupled to one another and conductive lead 56 at node A and polysilicon leads 38 and 76 are coupled to one another and conductive lead 58 at node B. The pairs of polysilicon leads may be so coupled using a conductive material such as tungsten or the like. Conductive leads 56 and 58 may be the first metal layer in a plurality of metal-metal interconnect layers and may be formed of copper, aluminum, or other suitable materials used as metal interconnect materials. Conductive leads 56 and 58 extend longitudinally through cell 40 and zigzag throughout the cell to provide for further integration of other features (not shown). According to other exemplary embodiments, conductive leads 56 and 58 may take on other shapes including a straight line, as they extend through cells 40 which may be word line decoders or other cells.

Figure 4B:
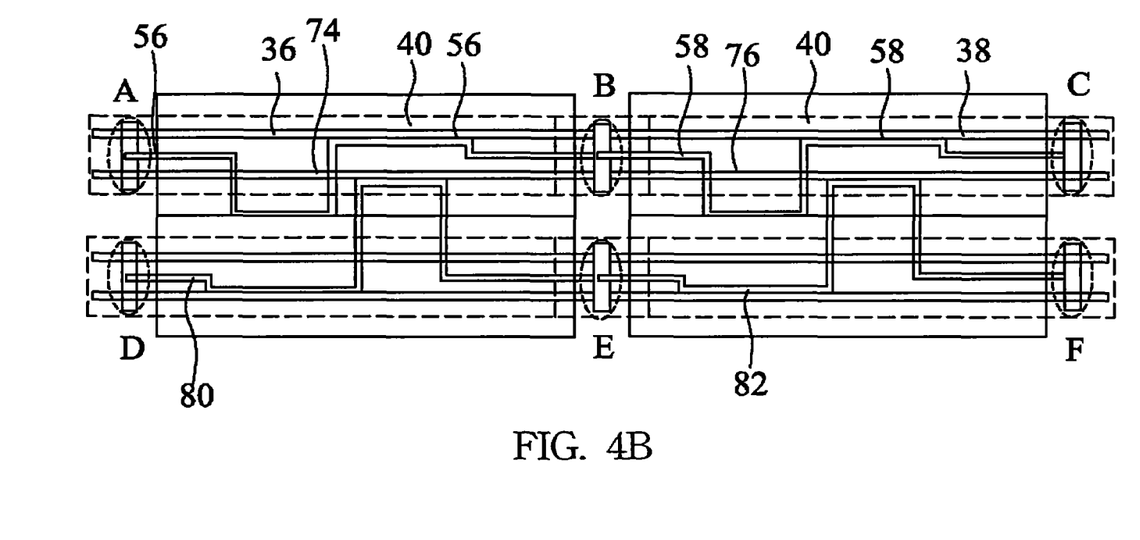

Conductive leads 80 and 82 also extend longitudinally through cell 40 and include a slightly different path. Conductive leads 80 and 82 may similarly couple transistors and polysilicon leads such as described for conductive leads 56 and 58. In each case, exemplary conductive leads 56, 58, 80 and 82 are formed from a metal-metal interconnect layer that may be formed of copper, aluminum or other suitable interconnect materials.

Figure 4C:
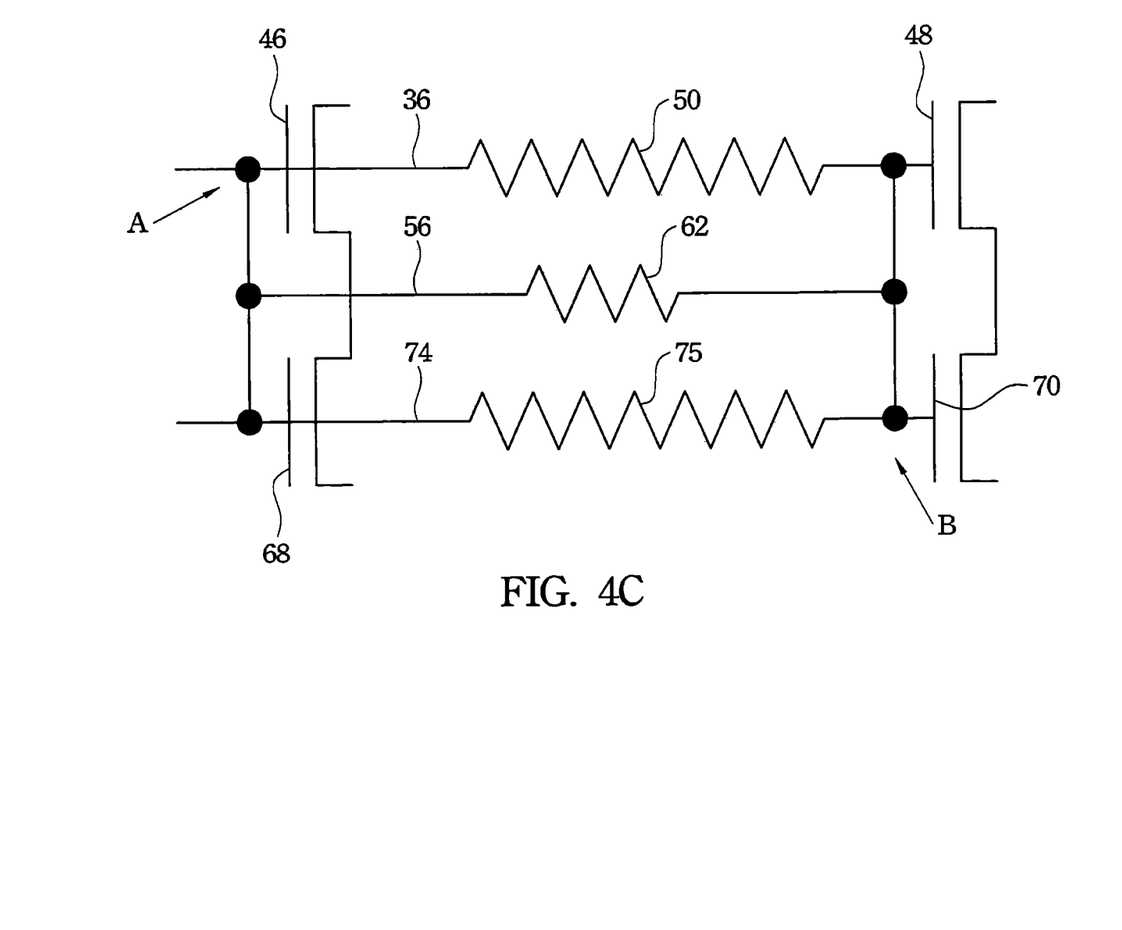
FIG. 4C shows a further wiring diagram.

FIG. 4C shows another exemplary wiring diagram 59 that represents a portion of combined wiring diagrams 55 and 57. Wiring diagram 59 shows polysilicon leads 36 and 74 coupling transistors 46 and 68, respectively, situated at or near node A, to transistors 48 and 70 situated at or near node B. Conductive lead 56 with lessened resistance 62 couples both transistors 46 and 68 situated at or near node A to both transistors 48 and 70 situated at or near node A and provides a path of reduced resistance with respect to polysilicon leads 36 and 74. Resistance 62 is less than resistance 50 or resistance 75.

According to one exemplary embodiment, conductive leads 56, 58, 80 and 82 may be a metal 1 layer of a three metal interconnect layer embodiment and according to another exemplary embodiment, conductive leads 56, 58, 80 and 82 may be a metal 2 layer, i.e. an intermediate interconnect metal layer, of a three metal interconnect layer embodiment but it should be understood that conductive leads 56, 58, 80 and 82 may represent a metal layer other than the uppermost metal layer in a device with multiple metal interconnect layers. According to various exemplary embodiments, this enables the upper metal interconnect layer to serve as or to interconnect word lines and/or serve other purposes. According to various exemplary embodiments, the metal interconnect layer beneath the uppermost layer, may be a metal-metal interconnect layer that is formed of a metal interconnect material such as aluminum, copper or a suitable metal alloy, and which serves as or interconnects power lines, ground lines and may also interconnect word lines formed of the upper most metal interconnect layer. According to convention, "metal 1" or "metal 1+n" refers to a metal-metal interconnect layer.

According to one exemplary embodiment in which three metal layers are used and in which conductive leads 56, 58, 80 and 82 are either the lowermost metal-metal interconnect layer or the intermediate metal-metal interconnect layer, the intermediate metal-metal interconnect layer, i.e. metal 2, is formed using 1P1E technology, i.e. DPL is not used and a single photomask and a single set of photolithography and etching operations, can be used to pattern the intermediate metal interconnect layer. According to another exemplary embodiment, all of the metal-metal interconnect layers are patterned without DPL technology. The metal-metal interconnect layers may be formed using suitable known and future developed non-DPL photolithography operations. The polysilicon lead stitching is done by one of the underlying metal-metal interconnect layers or another subjacent conductive layer and the uppermost metal-metal interconnect layer is not needed to extend downward to stitch the polysilicon leads and thus the transistors.

Figure 5A:
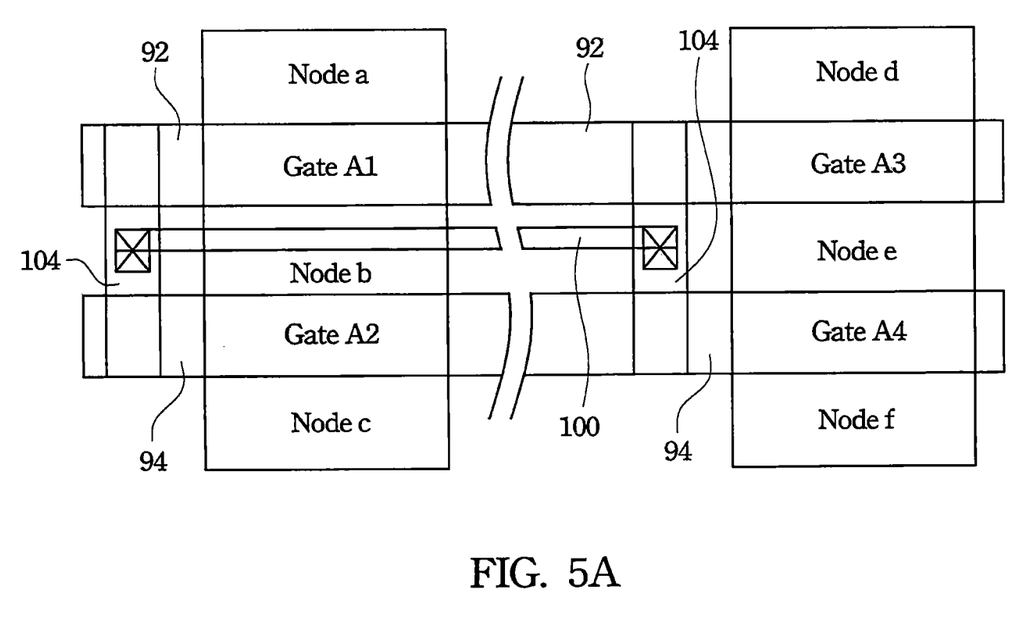
FIGS. 5A and 5B show a plan view of a device layout and a wiring diagram, respectively, showing the stitching of transistors according to an aspect of the disclosure.
Figure 5B:
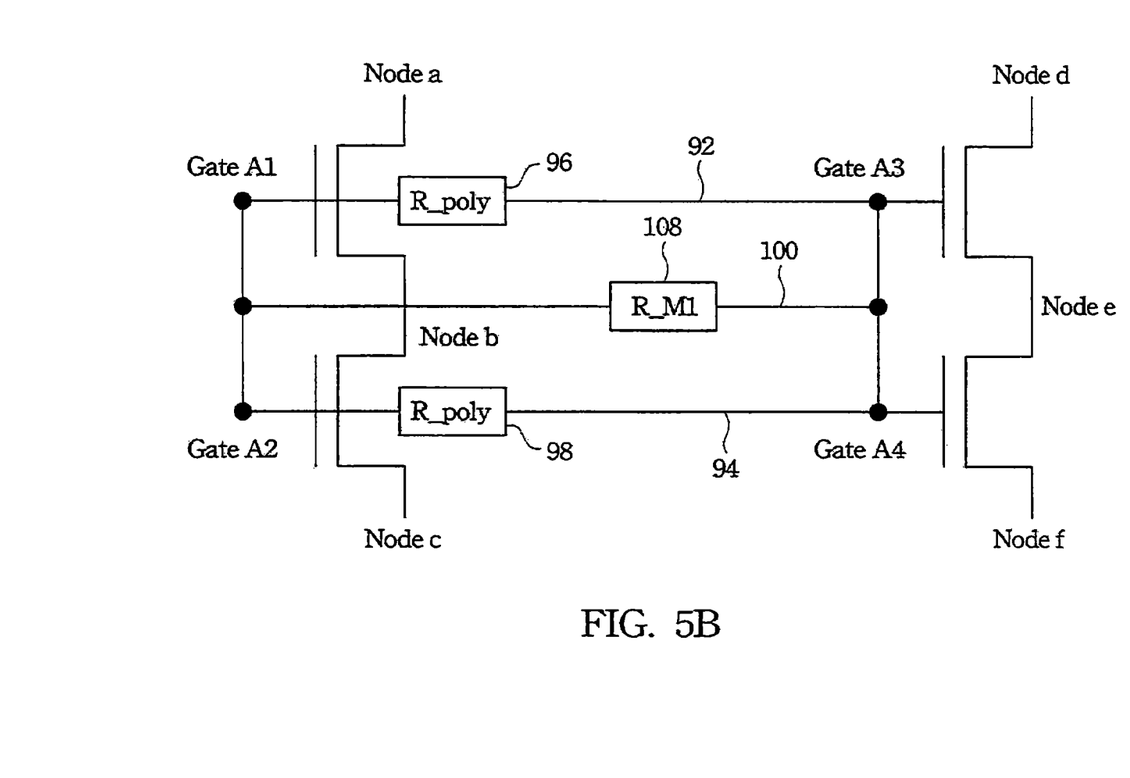

FIGS. 5A and 5B present another perspective view of aspects of the disclosure. Aspects of the device layout of FIG. 5A correspond to the wiring diagram shown in FIG. 5B. FIGS. 5A and 5B show transistors having transistor gates A1, A2, A3, and A4. A transistor having transistor gate A1, is coupled to a transistor having transistor gate A3 by polysilicon lead 92 which may serve as the gate in each transistor. A transistor having transistor gate A2, is coupled to a transistor having transistor gate A4 by polysilicon lead 94 which may serve as the gate in each transistor. Polysilicon lead 92 has an associated resistance 96 and polysilicon lead 94 has an associated resistance 98. Conductive lead 100 which may be copper, or aluminum, or another layer used to form a metal-metal interconnect layer, couples polysilicon lead 92 near nodes a and b to polysilicon lead 92 near nodes d and e and also couples polysilicon lead 94 from near nodes b and c to polysilicon lead 94 near nodes e and f. As suggested by use of the breakaway lines, the distance between nodes a, b, c and nodes d, e, f, may be significant, producing a high line resistance. Conductive lead 100 with reduced resistance 108 provides a lower resistance path for a signal, i.e. current, to travel from transistor gate A1 to A3 and also from transistor gate A2 to gate A4. Conductive lead 100 may extend through a word line decoder cell or from one word line decoder cell to another, in various exemplary embodiments.

According to one aspect, the disclosure provides a method for forming a semiconductor device comprising forming a substructure including device cells and a pair of transistors spaced apart from one another and having respective gates. The device cells include at least three metal-metal interconnect layers including a lower metal-metal interconnect layer, a middle metal-metal interconnect layer and an upper metal-metal interconnect layer. The method further comprises forming a pattern in the middle metal-metal interconnect layer using only one photomask and only one etching operation, and forming a first metal pattern in the lower metal-metal interconnect layer, the first metal pattern comprising a first metal lead that couples the gates of the pair of transistors.

According to yet another aspect, the disclosure provides a method for forming a word line decoder semiconductor device comprising forming a substructure including word line decoder cells and a pair of transistors spaced apart from one another and having respective gates coupled by a polysilicon lead, the word line decoder cells including three metal interconnect layers including a lower metal interconnect layer, a middle metal interconnect layer and an upper metal interconnect layer. The method further comprises forming a second metal pattern in the second metal interconnect layer using only one photomask, only one photolithography exposure operation; and only one etching operation, and coupling the pair of transistors together using a metal lead from the second metal pattern, the metal lead extending through the word line decoder cell.

According to yet another aspect, the disclosure provides a semiconductor word line decoder device comprising: a plurality of word line decoder device cells including multiple patterned metal-metal interconnect layers including at least a lower patterned metal-metal interconnect layer, a middle patterned metal-metal interconnect layer and an upper patterned metal-metal interconnect layer; and a pair of transistors spaced apart from one another and having respective gates coupled by a polysilicon lead and further coupled by a metal lead of one of the lower patterned metal-metal interconnect layer and the middle patterned metal-metal interconnect layer The preceding merely illustrates the principles of the disclosure. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,"

"above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the invention, which may be made by those skilled in the art without departing from the scope and range of equivalents.

What is claimed is:

1. A semiconductor word line decoder device comprising:
   a plurality of word line decoder device cells including multiple patterned metal-metal interconnect layers including at least a lower patterned metal-metal interconnect layer, a middle patterned metal-metal interconnect layer and an upper patterned metal-metal interconnect layer; and
   a pair of transistors spaced apart from one another and having respective gates coupled by a polysilicon lead and further coupled by a metal lead of one of said lower patterned metal-metal interconnect layer and said middle patterned metal-metal interconnect layer and a further pair of transistors spaced apart from one another and having respective further gates coupled by a further polysilicon lead, wherein said metal lead further couples said further gates, said metal lead, said polysilicon lead and said further polysilicon lead are parallel to one another, and
   said pair of transistors are disposed in different word line decoder device cells of said plurality of word line decoder device cells and said further pair of transistors are disposed in different word line decoder device cells of said plurality of word line decoder device cells.

2. The semiconductor word line decoder device as in claim 1, wherein said middle patterned metal-metal interconnect layer includes a pitch no less than about 88 nm.

3. The semiconductor word line decoder device as in claim 1, wherein said metal lead comprises a lead of said lower patterned metal-metal interconnect layer.

4. The semiconductor word line decoder device as in claim 3, wherein said pair of transistors are disposed at respective longitudinal ends of adjacent word line decoder device cells of said plurality of word line decoder device cells and said polysilicon lead and said metal lead of lower patterned metal-metal interconnect layer extend longitudinally through at least a first word line decoder device cell of said plurality of word line decoder device cells.

5. The semiconductor word line decoder device as in claim 1, wherein said metal lead comprises a lead of said middle patterned metal-metal interconnect layer and wherein said plurality of word line decoder device cells are arranged in an array and said pair of transistors are disposed in different word line decoder device cells of said plurality of word line decoder device cells and said lower patterned metal-metal interconnect layer, said middle patterned metal-metal interconnect layer and said upper patterned metal-metal interconnect layer are formed of copper.

* * * * *